United States Patent [19]
Maby et al.

[11] 4,296,144

[45] Oct. 20, 1981

[54] ION IMPLANTED STYLUS

[75] Inventors: Edward W. Maby, Plainsboro; Hirohisa Kawamoto, Princeton; Pierre V. Valembois, Cranbury, all of N.J.

[73] Assignee: RCA Corporation, New York, N.Y.

[21] Appl. No.: 142,982

[22] Filed: Apr. 23, 1980

[51] Int. Cl.³ .............................................. C23C 11/00
[52] U.S. Cl. ...................................... 427/38; 369/173
[58] Field of Search ................................... 427/35, 38; 179/100.1 B, 100.1 G, 100.3 V, 100.41 R, 100.41 G; 204/192 N

[56] References Cited

U.S. PATENT DOCUMENTS

| | | | |
|---|---|---|---|
| 3,496,027 | 2/1970 | King et al. | 148/1.5 |
| 3,842,194 | 10/1974 | Clemens | |
| 3,930,117 | 12/1975 | Clemens et al. | 179/100.1 B |
| 4,104,832 | 8/1978 | Keizer | 51/281 R |
| 4,162,510 | 7/1979 | Keizer | 179/100.41 G |

FOREIGN PATENT DOCUMENTS 2912550 10/1979 Fed. Rep. of Germany.

OTHER PUBLICATIONS

Hauser, "Appl. Phys. Letters", V30, pp. 129–130 (1977).
Burgoin, "Diamond Research 1975", pp. 24–28, Industrial Diamond Research Bur., London.

*Primary Examiner*—John H. Newsome
*Attorney, Agent, or Firm*—Birgit E. Morris; Allen Bloom

[57] ABSTRACT

An improved method for fabricating a diamond video disc playback stylus. The method comprises the steps of preparing a bottom surface which contacts the video disc and producing a conductive layer adjacent to the bottom surface by ion implantation. The improvement lies in annealing the diamond at about 850° to about 1500° C.

8 Claims, No Drawings

ION IMPLANTED STYLUS

This invention relates to a stylus for use with a high density information disc. More particularly, this invention relates to a stylus of a diamond dielectric support material which is ion implanted and annealed to form a buried conductive layer.

BACKGROUND OF THE INVENTION

U.S. Pat. No. 3,842,194 to Clemens discloses a high density information, e.g., video, disc for use in a playback system utilizing variable capacitance. In one configuration of the Clemen's system information representative of recorded pictures and sound is encoded in the form of a relief pattern in a relatively fine spiral groove in the surface of the disc record. For example, groove widths of about 2.6 micrometers and groove depths of about 0.5 micrometer may be used. During playback a pickup stylus about 2.0 micrometers wide having a thin conductive electrode thereon, for example about 0.2 micrometer thick, engages the groove as the record is rotated by a supportive turntable. Capacitive variations between the stylus electrode and the record surface are sensed to recover the prerecorded information.

Clemens discloses in the aforementioned patent a triangular shaped stylus having one face coated with a conductive coating. In particular, transition metals such as hafnium, titanium or tantalum may be used as the conductive metal coating.

Keizer, in U.S. Pat. No. 4,162,510, incorporated herein by reference, discloses a playback stylus which may be used with ths grooved capacitive disc system. The keel tipped pickup stylus comprises a dielectric support element having a body, a constricted terminal portion and shoulders interconnecting the body with the constrictive terminal portion. The constrictive terminal portion is defined by a prow, a substantially flat rear surface remote from said prow, side surfaces extending from the edges of the rear surface, a bottom surface extending from the bottom edge of the rear surface and a plurality of additional surfaces extending from the prow and intersecting the bottom and the side surfaces. A conductive layer on the substantially flat rear surface serves as the electrode. The maximum separation between the substantially parallel side surfaces is less than the given groove width. The bottom surface of the stylus may be shaped to conform to the shape of the groove.

However, a problem has been encountered with the use of a metal conductive coating as the electrode. When the stylus contacts the record surface the portion of metal coating closest to the record surface may wear away. Furthermore, problems have been encountered at the interface between the metal coating and the diamond dielectric support material. Poor adhesion is often observed with concomitant flaking off of the metal coating.

The copending application of C. W. Mueller et al entitled "Ion Implanted Diamond Video Disc Stylus", Ser. No. 134,906, which is incorporated herein by reference, describes a diamond video disc stylus in which a conductive layer is formed at the diamond surface by ion implantation. The ion implantation process leads to increased conductivity of the diamond, sufficient at minimum ion dosage levels to be useful in the above-described playback system.

SUMMARY OF THE INVENTION

In improved method for fabricating a diamond video disc playback stylus which includes the steps of preparing a bottom surface which contacts the video disc and producing a conductive layer adjacent to the bottom surface by ion implantation. The improvement lies in annealing the ion implanted diamond from about 850° to about 1500° C.

DETAILED DESCRIPTION OF THE INVENTION

Ion implantation is a method for introducing atoms below the surface of a solid substrate. Ions of the atoms to be introduced are accelerated so that they bombard the substrate surface at a uniform high energy, generally in the kilo-electron-volt (keV), that is $10^3$ eV, to mega-electron-volt (MeV), that is $10^6$ eV, energy range. The distribution of the ions has a Gaussian shape as a function of the depth beneath the substrate surface. The effective thickness of the ion implanted layer is defined as twice the standard deviation of the Gaussian distribution of the implanted ions.

In the present invention the face of the diamond dielectric support element is ion implanted so as to form a layer which is to act as the conductive layer. The diamond may be either natural or synthetic. The ion implanted element is then annealed in vacuum.

In ion implantation the ions are accelerated and generally travel in a straight line. As a result, only the exposed area of the substrate will be implanted. This property is particularly useful for a video disc stylus because if areas other than the electrode face are ion implanted, spurious signals may be picked up which interfere with those picked up by the electrode face.

The depth at which ions are implanted is a function of the energy of the accelerated ions. The greater the energy the deeper the ions are implanted into the diamond. The effective thickness of the ion implanted conducting layer must be sufficient to pick up the signal recorded in the video disc replica. A preferred thickness has been found to be from about 1000 to about 1200 angstroms for best electrical performance. Generally accelerating energies of about 50 to 300 keV may be used. If the conductive layer thickness prepared by the ion implantation is too thin, the capacitance between the stylus electrode and the video disc surface will be too small and as a result the recovered signal will be too weak to be useful. If the electrode thickness is too great, the pickup stylus will simultaneously recover signals from more than one signal element and undesirable crosstalk or interference will result.

It has been found that a sheet resistance of the ion implanted layer at 915 megahertz (MHz) of about 360 ohms per square or less allows the ion implanted stylus to be useful for recovering signals recorded in a conductive vinyl video disc replica.

The annealing must be done in the absence of oxygen or water in order to prevent the diamond from being oxidized. A vacuum of at least about $10^{-6}$ torr is the preferred method. Inert gases such as Ar could be used if trace amounts of water or oxygen which degrade the diamond during annealing are removed. The annealing temperature range should be in the range of about 850° to 1500° C. If a temperature greater than 1500° C. is used the diamond graphitizes. At less than about 850° C. either the time needed to effect the desired changes is too long or the changes do not occur. The annealing results in a decrease of the surface conductivity. As a result the ion implanted conductive layer is electrically isolated from the surface and is surrounded by two diamond dielectric regions. The structure therefore consists of a buried conductive layer between two diamond dielectrics. Clemens et al, in U.S. Pat. No. 3,930,117, disclose a stylus dielectric support element having a conductive metal layer which is in turn coated with a dielectric layer. Dielectric anisotropy about the conductive metal layer of a capacitive playback stylus is associated with "soundbeat" (interference in the sound signal caused by dielectric anisotropy about the stylus conductive layer). A depth of at least about 1600 angstoms for the maximum ion concentration is preferred in order to significantly reduce soundbeat.

In order for a buried layer to be useful for the present invention it must be conductive after the annealing step. After annealing, an ion implanted layer in diamond is generally no longer conductive. However, if B or Li is the ion implanted atom, the implanted layer remains conductive and indeed increases somewhat in conductivity as a result of annealing. At the same time there is a rapid fall off in conductivity from the concentration maximum of the implanted layer so that the diamond on both sides is substantially non-conductive. The ion implantation dose is the number of implanted ions per square centimeter of implanted surface. A dose of from about $5 \times 10^{15}$ to $4 \times 10^{16}$ B atoms per square centimeter at an acceleration energy of about 200 keV is preferred for diamond styli to be used in conjunction with conductive vinyl video disc replica.

The resistivity of the bulk diamond which is not affected by ion bombardment is generally greater than about $1 \times 10^5$ ohm-centimeters. Before annealing, the resistivity of regions of the diamond in the path of the ion beam, but having no significant concentration of the ion (that is, the region merely damaged by the ion bombardment) is about 80-210 ohms/square by four point probe measurement for doses of from about $1 \times 10^{16}$ to about $4 \times 10^{16}$ B atoms per square centimeter at an acceleration energy of 200 keV. There is considerable evidence that the resistivity of the merely damaged region increases substantially upon annealing.

Since annealing renders the damaged areas of the diamond electrically neutral, the conductivity of the buried ionic layer is believed to be caused by the effect of the implanted ions on the valence and conduction bands of the diamond host. Thus, the B energy level is believed to be about 0.37 eV above the diamond valence band edge while the Li energy level is believed to be about 0.31 to 0.4 eV below the diamond conduction band edge. Other implanted atoms which are similar to B in that they have a vacant energy level close in energy to the valence band of diamond or similar to Li in that they have a filled energy level close to the conduction band of diamond should also be useful.

The buried ion implanted layer must be electrically coupled to signal processing equipment so that the capacitive changes between the video disc record surface and the buried conductive layer can be processed. A preferred method of electrical coupling is capacitive coupling. For example, the surface of the face of the diamond dielectric support element which was ion implanted may be coated with a silver paint or an evaporated metal layer. If the surface capacitive coupling layer does not extend to the bottom surface of the stylus and thereby contact the surface of the disc, the coupling layer need not have the toughness and wearability of the metal conductive layers of the prior art which contact the disc record surface.

The ion implantation and annealing steps may be done at any stage of stylus fabrication prior to the addition of a capacitive coupling layer.

U.S. Pat. No. 4,104,832, incorporated herein by reference, discloses a method for manufacturing a keel tipped stylus. A tapered dielectric support element made from a hard material, such as diamond or sapphire, is contacted with an abrasive lapping disc having a deep, trapezoidal, coarse pitched groove. The lands on the lapping disc lap the shoulders of the keel tipped stylus and the walls of the abrasive groove form the substantially parallel side surfaces of the constricted terminal portion.

The stylus of this invention is not limited to use with grooved capacitive high density information discs but may be employed with non-grooved capacitive high density information discs as well.

The present invention will be further illustrated by the following Examples, but it is to be understood that the invention is not meant to be limited to the details described herein.

EXAMPLE

A 0.25×0.25×2.00 millimeter keel-tipped natural diamond was cemented to a 2.25 inch. (5.7 centimeter) diameter 0.8 millimeter thick polished stainless steel wafer with silver paste. A {110} diamond face was parallel to the wafer surface. The wafer was then placed in the target chamber of an Accelerators, Inc. (Austin, Tex.) 300 keV ion implanter. The normal to the surface of the wafer to which the diamond was attached was 6° off from alignment with the axis of the implant beam in order to prevent channeling. A B″ implant beam was raster scanned, that is, x-y scanned across the {110} diamond face by means of electrostatic deflection plates. The energy of the ion implant beam was 200 keV. The beam was shut off after a dose of $1.5 \times 10^{16}$ B″ atoms per square centimeter had been achieved, as measured by a current integrator (Brookhaven Instruments).

The boron concentration maximum of $1.7 \times 10^{21}$ B″ atom per cubic centimeter was found at a distance of 0.32 micrometer, from the surface as determined by secondary ion mass spectrometry. The B″ distribution was Gaussian with a full width at half height of 880 angstroms.

The ion implanted diamond was annealed in a Lepel Corp. radio frequency heated furnace, model no. T-10-3-KC-A-H. The diamond was placed in a 4 centimeter diameter × 10 centimeter high carbon cup which was then inserted into the oven. The oven was evacuated until the pressure was less than about $1 \times 10^{-6}$ torr. The oven was then heated to 1150° C. for 30 minutes. The oven was allowed to cool to room temperature in vacuo.

The diamond was removed and the resistivity of the ion implanted layer was determined. The stylus was coated with silver paint at two ends of the ion implanted face. The separated silver painted areas and the buried implanted layer form two parallel plate capacitors. The implanted boron layer may be approximated by a sheet resistance layer so that the circuit between the two silver-painted areas is represented by a series C-R-C circuit.

The value of C and R have been found with a transmission-line reflection-type measurement technique using a Hewlett-Packard model 8505A network analyzer interfaced with a Tektronix model 4051 desk top computer. The sheet resistance of the buried layer is expressed as $R_\square = (W/L)R$, where W is the width of the stylus, L the separation between the silver paint areas and R the measured resistance. The relative dielectric constant has been calculated from the expression $\epsilon r = 2C'd/A\epsilon_o$, where C' is the measured series capacitance, d the thickness of the diamond layer between the silver-paint layer and the implanted boron layer, A the area of the silver-painted layer and $\epsilon_o$ the dielectric constant of the air.

The sheet resistance of the buried layer was 65 ohms/square at a frequency of 915 megahertz (MHz). The relative dielectric constant of the bombarded diamond layer ($\epsilon/\epsilon_o$) is 6.7 at 915 MHz. The relative dielectric constant for diamond which has not been subject to ion bombardment is 5.7.

EXAMPLES 2-7

Diamond styli were treated and tested as in Example 1 except that the boron dose and annealing temperature were varied. Results are compiled in the Table.

TABLE

| Example | Boron Dose B" Atoms $(cm^{-2})$ | Annealing Temperature (°C.) | Sheet Resistance of Buried Layer $(\Omega/\square)$ 915 MHz | Relative Dielectric Constant of Bombarded Diamond Layer $(\epsilon/\epsilon o)$ 915 MHz |
|---|---|---|---|---|
| 2 | $1.5 \times 10^{16}$ | 850 | 140 | 1.6 |
| 3 | $1.5 \times 10^{16}$ | 850 | 170 | 1.3 |
| 4 | $1.5 \times 10^{16}$ | 1000 | 150 | — |
| 5 | $1.5 \times 10^{16}$ | 1000 | 180 | — |
| 6 | $1.5 \times 10^{16}$ | 1150 | 65 | 8.1 |
| 7 | $1.5 \times 10^{16}$ | no anneal | >1000 | — |

For Example 7 the dielectric constant could not be accurately determined because of the high sheet resistance of the buried layer. Example 7 was not annealed, but had the same dose as Examples 2-6. Thus, it can be concluded that the annealing step decreased the resistivity of the buried layer. The dielectric constant was not determined in Examples 4 and 5.

EXAMPLE 9

Four keel tipped diamond styli were treated as in Example 1 except that the boron dose was $2.4 \times 10^{16}$ B atoms per square centimeter. The annealing temperature was again 1150° C. The sound beat for four styli averaged 10 dB better than for 3 control styli having a conventional titanium conductive layer.

We claim:

1. In a method for fabricating a playback stylus which comprises a diamond dielectric support element for use with a capacitive information system including a high density information conductive disc which comprises the steps of forming a bottom surface for contacting the disc and preparing a conductive layer adjacent to the bottom surface by ion implanting a portion of the diamond dielectric support element;

the improvement comprising the additional step of annealing the ion implanted diamond at from about 850° to about 1500° C.

2. The method of claim 1 wherein the stylus is keel-tipped.

3. The method of claim 1 where the implanted ion is boron.

4. The method of claim 3 wherein the dose is about $5 \times 10^{15}$ to $4 \times 10^{16}$ B atoms per square centimeter.

5. The method of claim 1 wherein the implanted ion is lithium.

6. The method of claim 1 wherein the ion implanting accelerating energy is from about 50 to about 300 keV.

7. The method of claim 6 wherein the energy is about 200 keV.

8. The method of claim 1 wherein the annealing is performed in vacuum.

* * * * *